United States Patent [19]

Yeo et al.

[11] 4,089,105
[45] May 16, 1978

[54] METHOD FOR MOUNTING LEAD SOCKETS TO AN ELECTRICAL INTERCONNECTION BOARD

[75] Inventors: Herbert G. Yeo, Lincoln; John Nelson, North Kingstown, both of R.I.

[73] Assignee: Augat Inc., Attleboro, Mass.

[21] Appl. No.: 744,135

[22] Filed: Nov. 22, 1976

[51] Int. Cl.² .............................................. H05K 3/30
[52] U.S. Cl. ....................................... 29/626; 29/525; 29/739; 29/743
[58] Field of Search ................. 29/626, 739, 741, 759, 29/525, DIG. 44, DIG. 46, 743

[56] References Cited

U.S. PATENT DOCUMENTS

| | | | |
|---|---|---|---|
| 3,653,122 | 4/1972 | Powell, Jr. ......................... | 29/737 X |
| 3,667,103 | 6/1972 | Petree ................................ | 29/743 X |
| 3,785,035 | 1/1974 | Busler et al. ..................... | 29/739 |
| 3,924,325 | 12/1975 | Kufner ............................. | 29/739 X |

Primary Examiner—Carl E. Hall
Attorney, Agent, or Firm—Weingarten, Maxham & Schurgin

[57] ABSTRACT

A method for mounting lead sockets in the holes in an electrical interconnection board. The lead sockets are hollow cylindrical elements having a tapered opening at one end and a plurality of normally converging flexible fingers at the other end. The lead sockets are force fitted into the holes in the board with the receptacle end of the socket opening into the component side of the board. The lead sockets are vibrated into place while a vacuum is applied to temporarily seat the lead sockets in the holes in the board. The lead sockets are then finally force fitted into the holes in the board by several alternative means. The apparatus for accomplishing the method of this invention is also disclosed.

12 Claims, 8 Drawing Figures

METHOD FOR MOUNTING LEAD SOCKETS TO AN ELECTRICAL INTERCONNECTION BOARD

FIELD OF THE INVENTION

This invention relates generally to electrical interconnection means and more particularly concerns a method and apparatus for mounting lead sockets in holes in electrical interconnection boards.

DISCUSSION OF THE PRIOR ART

Electrical interconnection boards, often referred to as printed circuit, printed wiring or panel boards, normally have mounted thereto a plurality of electronic components such as dual-in-line electronic packages which may be integrated circuit packages, or other types of electronic components formed with any number of leads. The boards are provided with holes therethrough and with printed circuit paths or conductive voltage planes on one or both surfaces thereof. In some prior art devices, leads of electronic components are inserted into plated-through holes which are electrically connected to various printed circuit paths or areas on the board surface. An electronic device lead is inserted through one of the plated-through holes and is normally individually soldered or collectively wave soldered so that the hole is filled with solder to permanently mount and electrically connect the component to the board.

It is often desired to employ the concept of pluggability, that is, to be able to plug the leads of a component into a board for whatever purposes are desired and then to remove it and plug another component into the board. This, of course, is not possible with the previously discussed method of mounting components to the board because the component leads are soldered thereto. However, it is well known to provide two-part socket sleeve assemblies which are mounted in holes in panel boards wherein one end of the sleeve has a lead receiving socket and the other end normally provides a solder tail or a wire wrapping pin. The solder tail or wire wrapping pin projects for some appreciable distance beyond the non-component side of the board and the lead receiving socket end of the sleeve normally projects a short distance beyond the other side of the board. The sleeve socket end is necessarily somewhat larger than might otherwise be desired because of the requirement that there be a tapered opening to facilitate inserting component leads and that there be a contact insert within the socket assembly device itself to frictionally engage the lead. Thus it is necessary that the socket end of the sleeve project beyond the board surface in order to provide the desired opening which is normally slightly larger than the hole through the board. When such a socket assembly with a contact insert is used, pluggability is available but at a relatively high cost because of the necessity for using the two-element socket assembly described above which not only is expensive to manufacture but the two elements must be combined before inserting into holes in the board.

SUMMARY OF THE INVENTION

It is an object of the present invention to provide pluggability of electronic components into interconnection boards, normally referred to as panel boards hereinbelow, at a substantially reduced cost while at the same time reducing the overall assembly thickness of the board and components. The result of thickness reduction is improved stacking density because each board may thereby be placed closer to the adjacent facing board.

Lead sockets which are substantially the same as used in sleeves previously built into the socket assemblies described above, are force fitted into plated-through holes in a panel board in such a manner that they are retained therein and are adapted to receive and removably retain the leads of electronic components, including dual-in-line electronic packages (DIP's). While these lead sockets retain the leads of the electronic components, it also permits them to be readily removed when desired, and replaced by other components whose leads are then inserted into the same lead sockets mounted in the board.

Broadly speaking, the method of the present invention mounts lead sockets in the holes in panel boards through the use of a vacuum means combined with a vibrating device. The leads are thereby temporarily seated in the holes and may then be semi-permanently mounted by means of a platen or roller which forces the lead sockets partially into the board holes. A multiplicity of hard spheres or tapered seating pins may, in conjunction with a matrix board having a hole pattern corresponding to the lead socket pattern in the panel board, be used in the process of finally seating the lead sockets. The spheres or balls may be employed to seat the lead sockets and at the same time countersink the top portion of the plated-through hole in the board to provide a tapered lead-in to facilitate insertion of the component leads into the holes and thereupon into the lead sockets. The seating pins as disclosed countersink the lead socket below the board surface.

The apparatus employed for performing the method is also the subject of this invention and comprises a box or frame connected to an evacuation means. A perforated top surface adjacent the panel board permits the vacuum to create an air flow downward through the panel board holes. When coupled with a vibrating device to spread the lead sockets over the panel board surface, the vacuum created air flow through the holes in the panel board temporarily seats the lead sockets therein. The lead sockets are further seated by means of a roller or platen and can be finally seated by means of the spheres or pins residing in matrix boards having the same hole configuration as the panel board. The final seating is accomplished in a hydraulic press.

BRIEF DESCRIPTION OF THE DRAWING

The advantages, features and objects of this invention will be more clearly understood from the following detailed description when taken in conjunction with the accompanying drawing in which.

DETAILED DESCRIPTION OF THE PREFERRED EMBODIMENT

Figure 1:
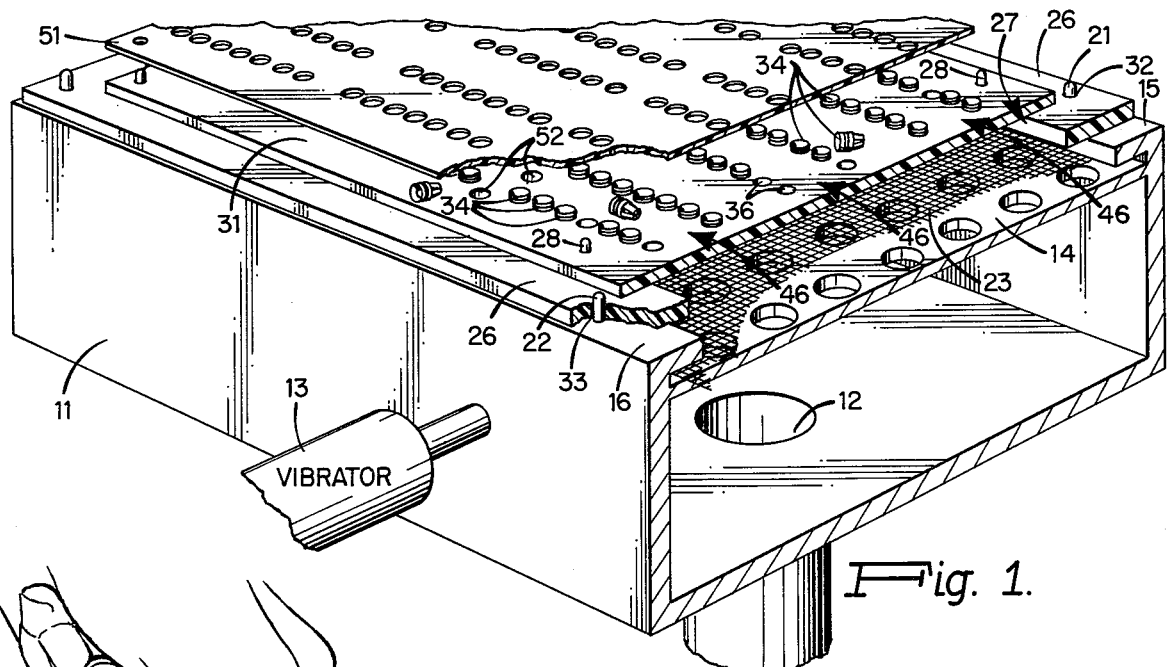
FIG. 1 is a partially broken away perspective view of the apparatus used in performing the method of this invention.

With reference now to the drawing and more particularly to FIG. 1 thereof, there is shown a rectangular enclosure or box 11 in which it is possible to obtain a low grade vacuum. An exhaust vent 12 is coupled to an evacuation means (not shown) and is mounted to or otherwise connected with a conventional industrial vibrator 13. While vibrator 13 is shown connected to box 11 in schematic fashion, it is likely that the box would be mounted directly to the top of such a vibrator. The top surface of the box is comprised of rigid perforated board 14 having a multiplicity of holes therethrough. The perforations are merely to provide passageways for air being evacuated from the box and need not have any particular configuration. Board 14 is recessed below shoulders 15 and 16 and has appropriate alignment means such as pins 21 and 22 mounted thereto and projecting upwardly. On top of board 14 is a fine mesh screen 23 which does not inhibit the flow of air but which prevents small parts from being drawn into the evacuation device.

Rigid frame board 26 having a central open area 27 normally rests on shoulders 15 and 16. The panel board 31 typically having printed circuit paths or voltage planes on at least one side thereof rests on top of frame board 26 with the normal margins of board 31 overlapping the edges of opening 27. All of the holes in board 31 open into central opening 27 of frame board 26. Frame board 26 may be provided with suitable alignment pins 28, similar to pins 21, 22 for mounting panel board 31 thereto.

Figure 2:
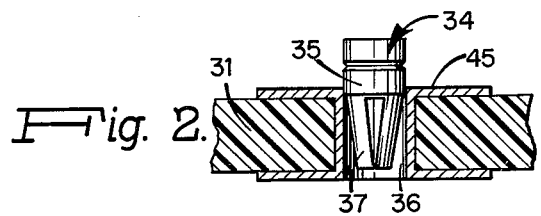
FIG. 2 is an enlarged sectional view showing a lead socket temporarily seated in a hole in the panel board.

Enclosure 11 will normally be inclined slightly with respect to the horizontal. When frame board 26 and panel board 31 are placed on shoulders 15, 16 with alignment pins 21 and 22 entering holes 32 and 33 respectively, a multiplicity of lead sockets 34, shown in greater detail in FIG. 2, are placed on top of panel board 31. The vibrator and the evacuation device are both energized and over the course of a few seconds, each of the open holes in panel board 31 is filled with a properly oriented lead socket 34. The body portion 35 of each lead socket is configured to form an interference fit with each of holes 36 in the panel board while converging flexible fingers 37 are smaller than holes 36 so that lead sockets 34 can only enter these holes in proper orientation. Vibrator 13 operates in the usual manner and causes the lead sockets to spread relatively evenly over the surface of panel board 31 and the converging finger end of the lead sockets tend naturally to enter holes 36. Because of the vacuum applied to box 11, there is a slight suction or movement of air passing downwardly through each of holes 36 thereby assisting in aligning and partially seating lead sockets 34 in the holes. It has been found that because lead sockets 34 are so short, approximately 0.1 inch (2.54 mm) they could vibrate out of holes 36 after they have initially entered such holes absent the added inpetus of the vacuum which temporarily seats them. Box 11 would typically have sides extending above board 31 to confine the lead sockets therein. Excess lead sockets are collected in an appropriate container at the low end of the board but some such elements may remain on the surface of the board when the operation is complete, thus the reason for screen 23. The sides and collection device of the apparatus are known and are not shown here to keep the drawing relatively simple.

Figure 5:
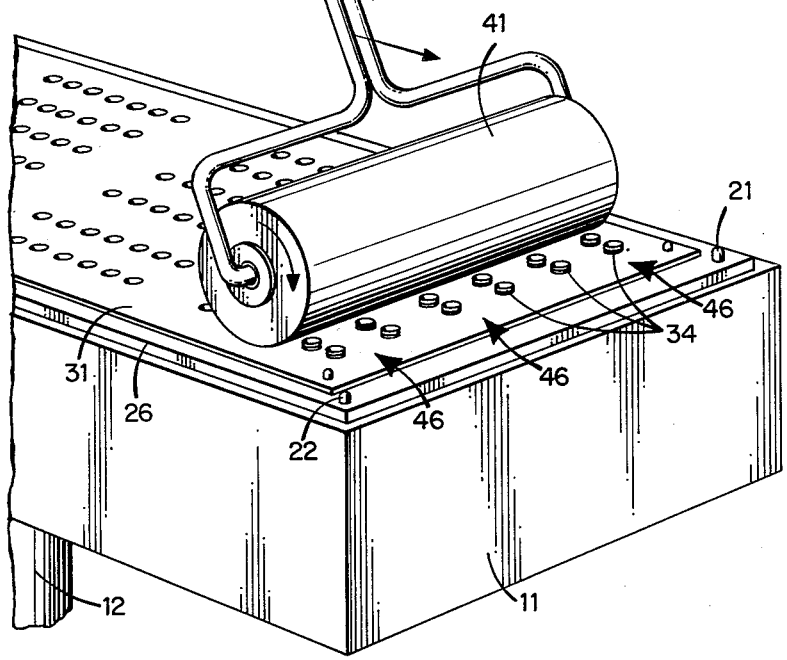
FIG. 5 is a perspective view of the outside of the structure of FIG. 1 showing apparatus for semi-permanently seating the lead sockets.

In addition to the vacuum seating, an additional step may be employed to semi-permanently seat the lead sockets in the holes in the panel board as shown in FIG. 5. In this step, a roller 41 having a handle 42 is used to force the lead sockets slightly into each of the holes in the panel board so that there is a positive force fit and no danger that any of the lead sockets could become dislodged when the panel board is handled for further processing. While this step is not necessary, it has been found to be advantageous in some circumstances. Alternatively, a flat platen could be used to simultaneously press all of the lead sockets a short distance into the holes. The purpose is merely to partially seat the lead sockets into the holes in the panel board and any suitable means may be used to accomplish this.

Figure 3:
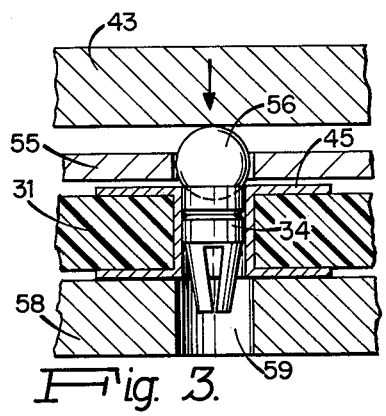
FIG. 3 is a sectional view similar to FIG. 2 showing the matrixes, platen and sphere used for finally seating the lead socket in the panel board.

When the lead sockets are partially seated in the holes, the panel board 31 is removed from enclosure 11, coupled with a support matrix board 58 as shown in FIG. 3, and transferred to a hydraulic press (not shown) where a platen 43 supported by stem 44 (FIG. 6), the platen covering the entire top surface of panel board 31, presses all of the lead sockets 34 simultaneously into the holes until the tops of lead sockets are flush with the top of the panel board. For this purpose, matrix board 58 having a hole pattern either the same as that of the lead socket pattern of the panel board or having holes therethrough on 0.1 inch centers, the modular spacing for panel boards used for mounting DIP's, is used to support the panel board and allow lead sockets 34 to extend somewhat beyond the bottom surface thereof. Matrix board 58 may be used in any of the seating steps involving a force applied to the top of board 31 but is shown only in FIG. 3. Note that the platen 43 of the hydraulic press actually rests on top of conductive plating 45 surrounding each of the holes 36. For all practical purposes, this may be considered to be the top surface of board 31 as described herein. Normally each of the holes in which a lead socket is seated will be a plated-through hole as shown in the drawing.

In FIG. 1, panel board 31 is shown with a plurality of dual-in-line arrays of holes 46. It is, however, possible that board 31 would not be comprised of dual-in-line arrays of holes or might include many other holes 52 additional to the dual-in-line arrays. It is also possible that it would be desired to insert a lead socket in less than all of the holes in the board and for that purpose, a masking matrix sheet 51 is shown in FIG. 1 in a position above board 31 having configurations of holes corresponding to those holes 36 in which it is desired to have lead sockets 34 seated in board 31. Mask sheet 51 may be very thin so that it merely masks holes 52 and does not provide any appreciable thickness to affect the insertion of lead sockets 34 in holes 36 in the panel board. Thus, it will be observed that holes 52 which are not part of dual-in-line arrays 46 in board 31 do not have corresponding holes in matrix sheet 51. In this way, when a supply of lead sockets are placed on top of matrix sheet 51 which has been placed directly over the top of panel board 31 and aligned therewith with suitable alignment means, lead sockets 34 will only enter those holes 36 which have corresponding holes in the matrix sheet. Otherwise, the procedures subsequent to seating the holes through the use of the matrix sheet are identical with those described above. Holes 52 are often formed in panel boards and are available to mount additional components such as decoupling capacitors to the board.

Figure 6:
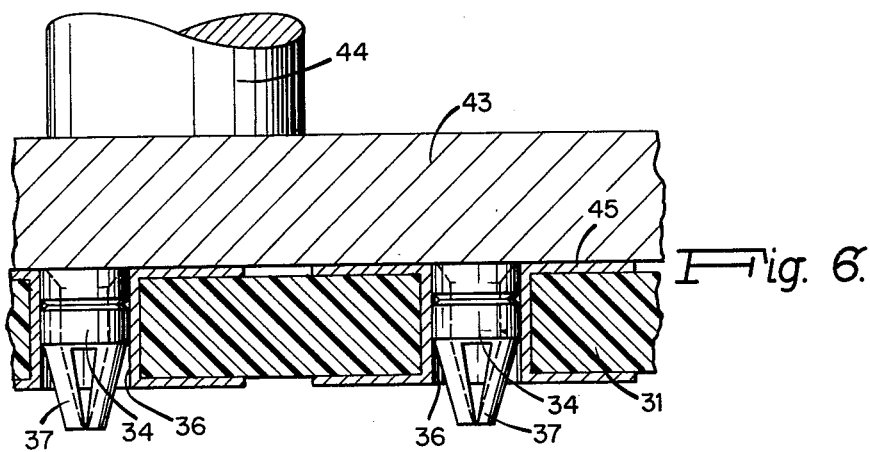
FIG. 6 is a sectional view of one apparatus for final seating of the lead sockets.

It is often desirable to seat lead sockets 34 still further into holes 16 beyond the position shown in FIG. 6. This is for purposes of providing a somewhat deeper lead-in for the tapered entry in each of the lead sockets and so that fingers 37 will project approximately 0.0625 inch (1.588 mm) beyond the non-component side of the board. There are two methods disclosed herein for countersinking the lead sockets as shown in FIGS. 3, 7 and 8.

Figure 4:
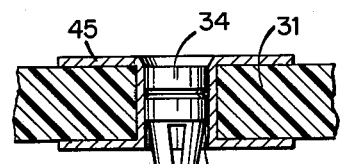
FIG. 4 is a sectional view similar to FIG. 2 showing the lead socket in final position.
Figure 7:
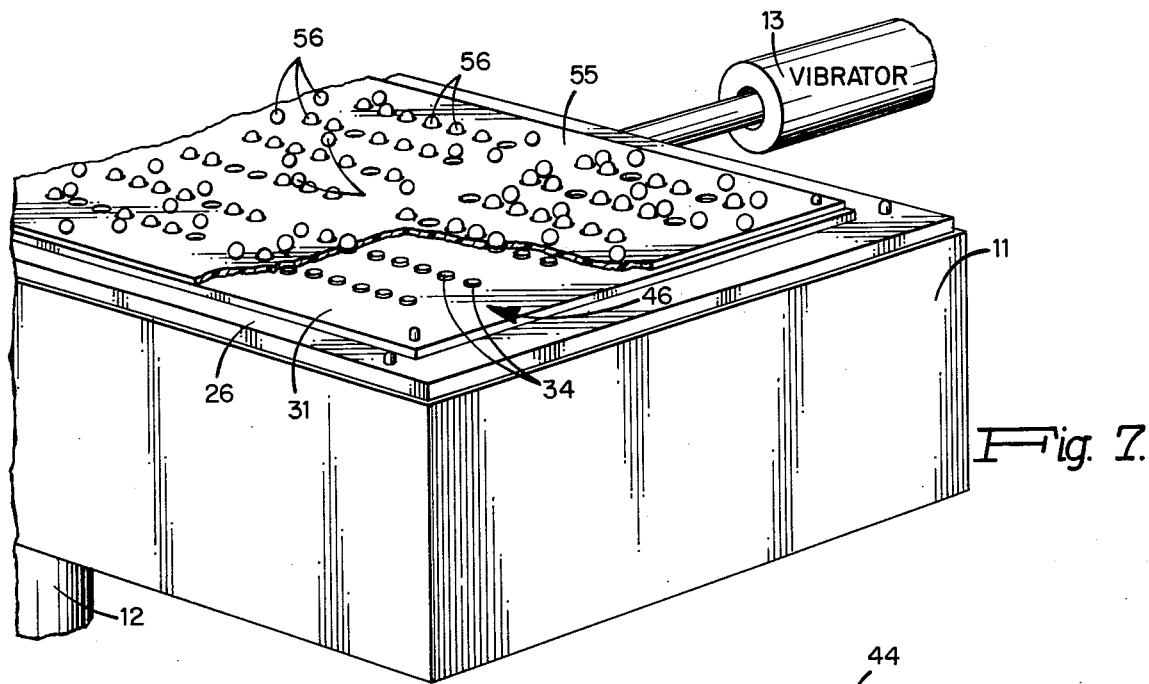
FIG. 7 is a perspective view similar to FIG. 1 showing alternative final seating apparatus.
Figure 8:
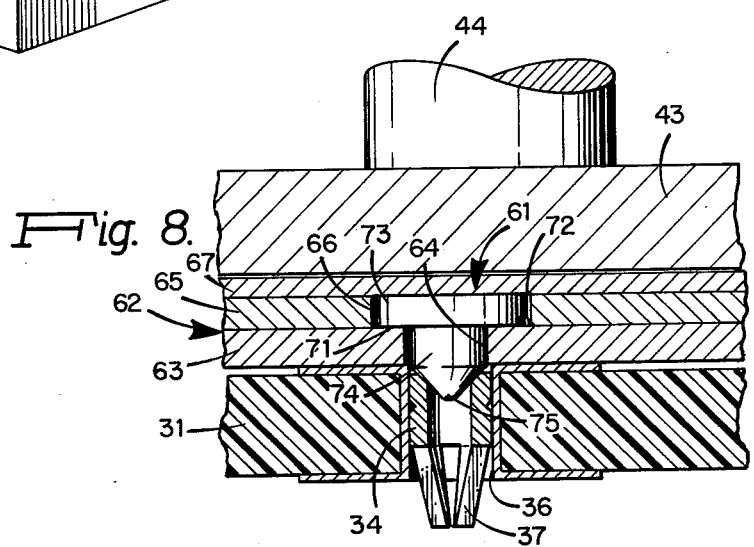
FIG. 8 is a sectional view similar to FIG. 6 showing still another final seating apparatus.

According to the method shown in FIGS. 3 and 7, a large number of balls or spheres 56 are placed on top of a matrix board 55 having a thickness somewhat less than the diameter of each of the balls. As shown in the drawing, matrix board 55 is placed directly over the top of panel board 31 and is aligned by suitable means such as the alignment pins previously mentioned so that each of the holes in which there is a lead socket in panel board 31 has a corresponding hole in matrix board 55. Balls 56 are distributed over the surface of matrix board 55 due to operation of vibrator 13 and drop into each of the holes in the matrix board. The vacuum means may, if desired, also be applied in this step simultaneously with the operation of the vibrator to speed up the location of balls in the matrix board holes. With reference now to FIGS. 2-4 and 7, it may be appreciated that the step represented in FIG. 7 may take place immediately after the temporary positioning of the lead sockets in holes 36 resulting from the steps associated with FIG. 1 in the position shown in FIG. 2, it may take place after the semi-permanent seating step of FIG. 5 as shown in FIG. 3 or even after the step shown in FIG. 6. If the balls are applied through matrix board 55 immediately after the initial seating step resulting in the configuration of FIG. 2, the frame board 26, panel board 31 and matrix board 55 with the balls 56 in the holes thereof are removed to the hydraulic press where a platen 43 similar to that shown in FIG. 6 is applied to the exposed surfaces of balls 56 (see FIG. 3) thereby forcing lead sockets 34 into holes 36 through the intermediary of balls 56. This step may be continued so that the balls are forced even further downward thereby countersinking the lead sockets somewhat as shown in FIG. 4 so that the top corners of the conductive plating 45 around holes 36 is somewhat rounded to provide a greater lead-in diameter to assist component leads in entering the lead sockets mounted in the holes in the panel board. The thickness of matrix board 55 with respect to the size of balls 56 determines the depth to which the lead sockets are countersunk into panel board 31 and provides a positive stop for the action of the hydraulic press. If desired, the thickness of matrix board 55 may be such that the lead sockets are only pressed into the board so that the top surface thereof is flush with the top surface of the conductive plating on top of the board, the position shown in FIG. 6.

Alternatively, lead sockets 34 may be seated in board 31 in accordance with the steps shown in FIGS. 5 and 6 prior to the application of matrix 55 and balls 56 thereto. For this purpose panel board 31 would be returned from the hydraulic press of FIG. 6 to vacuum/vibration box 11 and matrix board 55 would be applied to the top of the panel board as discussed above. When balls 56 are properly in the holes in the matrix board, the combination is then transferred to the hydraulic press for seating the lead sockets as previously described.

As previously mentioned, in cases where the panel board must be supported in that portion covering frame board opening 27, that is, where the panel board is particularly large or where it would otherwise tend to bow downward when the FIG. 3 step is performed, a matrix board 58 may be placed beneath the panel board. Such a matrix may take the place of the frame board before the assembly is transferred to the press.

In FIG. 8, there is shown an alternative means for final seating of the lead sockets in the holes in the panel board. Instead of balls 56, seating pins 61 are employed. A composite matrix board 62 is formed of a lower layer 63 which is nominally 0.0625 inch (1.588 mm) thick having a hole 64 approximately 0.042 inch (1.0668 mm) in diameter, and a layer 65 having a hole 66 approximately 0.08 inch (2.032 mm) in diameter in alignment with hole 64. In a manner similar to that shown in FIG. 7, composite matrix board 62 is placed in box 11 and pins 61 are vibrated and vacuumed into place as shown in FIG. 8 whereby shoulder 71 of pin 61 rests on ledge 72 on the top surface of layer 63 of board 62. Top portion 73 of pin 61 is substantially the same thickness as layer 65 of the composite matrix board 62 while the shank or bottom portion 74 is slightly longer than the thickness of layer 63, projecting between 0.005 and 0.01 inch (0.127 and 0.254 mm) below the bottom surface of layer 63. From that point, pin 61 tapers to a relatively blunt end 75, the angle of taper being substantially identical to the internal lead-in taper angle of lead socket 34. In order to insure that pins 61 fit easily in the holes in the matrix board, the top portion 73 has a diameter of approximately 0.078 inch (1.98 mm) and bottom portion 74 has a diameter of 0.04 inch (1.016 mm).

Matrix board 62 is configured with the two-step holes 64 and 66 in the same pattern as matrix board 55 of FIG. 7 so that a pin 61 rests in each hole where it is desired to firmly seat a lead socket in board 31. Board 31 is assembled with the lead sockets in the manner previously described, through the temporary seating of FIG. 2, the semi-permanent seating of FIG. 5 or the flush seating position shown in FIG. 6, and matrix board 62 is assembled with pins 61 in box 11 in the manner previously described with respect to FIG. 7. However, it is not necessary to apply matrix board 62 on top of panel board 31 to insert pins 61 since each pin is independently held in the holes in the matrix board. A third substantially rigid layer or plate 67 is normally secured by suitable means on top of layer 65 to retain pins 61 in their proper holes so that the composite board 62 can be handled and stored when not in use. In some cases plate 67 may not be used with matrix board 62 and seating pins 61 would be allowed to float in their holes. When applied on top of a panel board, because pins 61 are longer than the thickness of board 62, the seating pins will rise slightly in their matrix board holes and will be moved downward to seat lead sockets 34 pursuant to the force applied by the hydraulic press platen.

Allowing pins 61 to float in the matrix board facilitates their individual alignment with the socket ends of the lead sockets. This may be accomplished, if desired, with the use of plate 67 by providing a thin peripheral spacer between that plate and the top surface of board 65. Such structure retains pins 61 in place but permits them some element of motion in their individual holes in matrix board 62.

Since pins 61 can remain in the holes in matrix board 62 independently of panel board 31, only one such matrix board need be assembled for each run of a multiplicity of the same configuration panel boards.

Matrix board 62 is applied to the top surface of board 31 with appropriate alignment means similar to the pins shown in FIG. 1 and the combination of matrix board 62, panel board 31 and matrix board 58 (shown only in FIG. 3) is mounted in a hydraulic press. Platen 43 is applied to countersink lead sockets 34 in holes 36 in the board. The plated-through holes shown in FIG. 8 may be made somewhat larger than those shown in FIG. 3, having a diameter appropriate to provide a somewhat larger lead-in to the tapered socket opening. This is because the top of the plated-through hole is not countersunk as shown in FIG. 4.

In view of the above description and drawing, modifications and improvements will likely occur to those skilled in the art which are within the scope of this invention.

What is claimed is:

1. A method for inserting lead sockets directly into holes in an electrical interconnection panel board, said lead sockets having a socket opening at one end and a plurality of flexible converging fingers at the other end, said method comprising the steps of:

creating a flow of air downwardly through the holes in said panel board;

placing a multiplicity of said lead sockets on the top of said panel board;

vibrating said panel board, whereby upon the combined action of said air flow and vibration, said lead sockets are distributed over the top surface of said panel board and some of said lead sockets are seated in the holes therein, said lead sockets having a major diameter greater than the diameter of said holes in said panel board to provide an interference fit in said holes;

placing said panel board in a hydraulic press; and applying a force by means of a platen having a surface dimension substantially the same as the top surface of said panel board to the tops of said lead sockets to simultaneously seat all of said lead sockets flush with the top surface of said panel board.

2. The method recited in claim 1 and comprising the further step of applying an intermediate force to the tops of said lead sockets after said vibrating step to partially seat said lead sockets more deeply into said holes in said panel board.

3. The method recited in claim 1 wherein said air flow is created by applying evacuation means to the under side of said panel board.

4. The method recited in claim 2 wherein said intermediate force is applied by means of a roller passing over the tops of said lead sockets.

5. The method recited in claim 2 wherein said intermediate force is applied to all of said lead sockets uniformly and simultaneously by means of a platen having a surface dimension substantially the same as the top surface of said panel board.

6. The method recited in claim 1 and further comprising the step of applying a masking matrix sheet directly over the top surface of said panel board prior to said distributing step to permit said lead sockets to directly enter only selected ones of said holes in said panel board.

7. A method for inserting lead sockets into holes in an electrical interconnection panel board, said lead sockets having a socket opening at one end and a plurality of flexible converging fingers at the other end, said method comprising the steps of:

creating a flow of air downwardly through the holes in said panel board;

placing a multiplicity of said lead sockets on the top of said panel board;

vibrating said panel board, whereby upon the combined action of said air flow and vibration, said lead sockets are distributed over the top surface of said panel board and some of said lead sockets are seated in the holes therein;

applying a matrix board to the top of said panel board, said matrix board having a hole configuration identical with the configuration of said panel board in which said lead sockets are seated;

placing a multiplicity of balls on the top of said matrix board;

vibrating said matrix board, whereby said balls are distributed over the top surface of said matrix board and come to rest in the holes therein on top of the socket end of each said lead socket in the holes in said panel board; and applying a force to said balls to seat said lead sockets more deeply into said holes in said panel board.

8. The method recited in claim 7 and comprising the further step of creating a downward flow of air through the holes in said matrix board to facilitate distribution of said balls in said holes in said matrix board.

9. The method recited in claim 7 wherein said balls are sized so that said downward force tapers the top edge of each of said holes in said panel board and countersinks the tops of said lead sockets below the top surface of said panel board.

10. A method for inserting lead sockets into holes in an electrical interconnection panel board, said lead sockets having a socket opening at one end and a plurality of flexible converging fingers at the other end, said method comprising the steps of:

creating a flow of air downwardly through the holes in said panel board;

placing a multiplicity of said lead sockets on the top of said panel board;

vibrating said panel board, whereby upon the combined action of said air flow and vibration, said lead sockets are distributed over the top surface of said panel board and some of said lead sockets are seated in the holes therein;

placing a multiplicity of seating pins on the top surface of a matrix board, said seating pins having an enlarged diameter at one end and a conical point at the other end, said matrix board having a hole configuration identical with the configuration of said panel board in which lead sockets are seated, the holes in said matrix board being shaped and configured to retain one of said seating pins in each hole with the pointed end extending through each said hole;

vibrating said matrix board, whereby said seating pins are distributed over the surface of said matrix board and come to rest in the holes therein with the pointed end extending through each said hole;

placing said matrix board loaded with said seating pins on top of said panel board, the pointed end of one of said seating pins contacting each of the socket ends of said lead sockets; and applying a force to the enlarged top ends of said seating pins to seat said lead sockets more deeply into said panel board holes.

11. The method recited in claim 10 wherein said pointed ends of said seating pins are shaped and configured to countersink the tops of said lead sockets below the top surface of said panel board.

12. The method recited in claim 10 and comprising the further step of creating a downward flow of air through the holes in said matrix board to facilitate distribution of said seating pins in said holes in said matrix board.

* * * * *